United States Patent
Tatusch

[19]

[11] Patent Number: 5,818,878
[45] Date of Patent: Oct. 6, 1998

[54] METHOD AND APPARATUS FOR DECODING A DIPHASE-CODED DIGITAL SIGNAL

[75] Inventor: Reinhold Tatusch, Erkrath, Germany

[73] Assignee: NEC Corporation, Tokyo, Japan

[21] Appl. No.: 343,989

[22] Filed: Nov. 18, 1994

[30] Foreign Application Priority Data

Dec. 31, 1993 [DE] Germany .......................... 43 45 059.8

[51] Int. Cl.⁶ ................................................ H04L 27/22
[52] U.S. Cl. ............................................. 375/283; 375/330
[58] Field of Search .................................... 375/282, 283, 375/330, 333, 359–361; 341/70, 71

[56] References Cited

U.S. PATENT DOCUMENTS

| | | | |
|---|---|---|---|
| 4,287,596 | 9/1981 | Chari ........................................... | 375/49 |
| 4,616,314 | 10/1986 | Wilson et al. ............................. | 364/200 |
| 4,746,898 | 5/1988 | Loeppert ........................... | 340/347 DD |
| 4,992,790 | 2/1991 | Montgomery .............................. | 341/70 |
| 5,185,766 | 2/1993 | Cho ............................................ | 375/87 |
| 5,491,713 | 2/1996 | Kwok et al. .............................. | 375/333 |

FOREIGN PATENT DOCUMENTS

| | | |
|---|---|---|
| 0 448 152 A1 | 9/1991 | European Pat. Off. . |
| 59-22466 | 2/1984 | Japan . |
| WO 81/01637 | 6/1981 | WIPO . |

*Primary Examiner*—Stephen Chin
*Assistant Examiner*—Amanda T. Le
*Attorney, Agent, or Firm*—Foley & Lardner

[57] ABSTRACT

For decoding a diphase-coded signal the signal level is sampled with a sample signal of frequency equal to that of the bit clock pulse and each sample value is logically linked to the preceding sample value in accordance with an XOR function. This is preferably done by means of a microcontroller using interrupt routines for the sampling. The method is particularly advantageously applicable to transponder systems, for example contactless identification systems, the coding signal being modulated by the transponder onto a carrier signal; both the bit clock pulse and the sample signal of equal frequency thereto can be obtained by frequency division of the carrier signal.

2 Claims, 2 Drawing Sheets

METHOD AND APPARATUS FOR DECODING A DIPHASE-CODED DIGITAL SIGNAL

BACKGROUND OF THE INVENTION

The present invention relates to a method and an apparatus for decoding a diphase-coded signal indicative of coding of binary signals.

Diphase-coding is a type of coding for binary signals in which the signal comprises an edge, i.e. a level change, at the start of each bit period. Furthermore, zero bits and one bits differ from each other in that, in addition, in the center of the period, an edge or level change is present or absent.

The usual type of decoding of a diphase-coded signal by means of a microcomputer resides in that the presence or absence of the signal edge in the bit center is detected. For this purpose, synchronously but phase-displaced with each bit start edge in the center of the bit period, a time window is opened, and it is determined whether or not an edge occurs in the time window. With this time window method, each individual bit is clearly identified as zero or one bit independently of the preceding or following bits. However, this known decoding method has a number of disadvantages.

A first disadvantage is that a great number of function blocks of a microcontroller is required by the decoding process. An interrupt input is required with programmable edge sensitivity and a programmable timer is needed for positioning and generating the time window. For this purpose, and for detecting an edge or flank within the time window, a complicated decision and administration process is necessary, which places a high load on the CPU. The properties of the function blocks participating therein must be modified or reprogrammed several times within each bit period, in particular, the edge sensitivity of the interrupt input and the timer compare register.

A second disadvantage is the interference sensitivity. If edges generated by interferences occur within the time window, a "1" is incorrectly decoded as a "0". The error probability is proportional to the width of the time window. To keep the error small, narrow time windows are employed, and this requires a precise positioning of the time window. In intensive interrupt-controlled processes, this is frequently very difficult to achieve. Moreover, the inaccuracy of the duty factor of a diphase-coded zero limits the minimum width of the time window.

A further disadvantage resides in the requirement of positioning the time window as exactly as possible in the center of the bit period in order to detect the edges of the zero bit of the coded signal. If the coded signal is modulated onto a carrier frequency, by drift of said carrier frequency, for example due to temperature influences, the position of the bit center can shift and accordingly the position of the time window would have to be made to follow up, and this would require an on-line measuring of the bit period. To keep the expenditure within limits, the systems are therefore designed for a stable carrier frequency. Consequently, economic freely oscillating carrier oscillators cannot be used.

A still further disadvantage of the known decoding method resides in that it is sensitive to a sign change of the signal to be coded. If, for example, the coded signal is modulated onto a carrier signal by means of a transponder, the received signal, depending upon the chance initial state of the transponder and the demodulator, may be present in a signal state turned through 180°, and as a result, all the edges and levels of the signal to be decoded are inverted. The expenditure for the decision process in the decoder is thereby additionally increased.

SUMMARY OF THE INVENTION

It is therefore an object of the present invention to provide an improved method and an associated apparatus for decoding a diphase-coded signal which can be carried out with simple means and does not have the aforementioned disadvantages.

A method according to the invention is based on asynchronous sampling of the diphase-coded signal with subsequent differential decoding of the sampled signal level.

With this main technical feature, the present invention presents in particular the advantages as follows:

Only a few simple function blocks of a microcontroller are used for the decoding. Fundamentally, a simple input port for reading the coded signal in and an interrupt source operating with the bit frequency will suffice. The properties of the function blocks participating in the decoding need not be changed throughout the entire decoding process. Furthermore, the method is distinguished by high resistance to interference, i.e., the error probability is greatly reduced because only the level at the input port at the particular sampling instant is relevant to the result of the decoding. This makes the decoding substantially more robust than is the case with detection of an edge within a time window.

An essential advantage of the method according to the invention is furthermore that the exact position of the sampling instants within the bit periods is not critical. It need only be ensured that all the sampling instants lie in the dame half of the bit period, i.e., either in the first or in the second half. Thanks to this property, the method can be carried out with an economical RC oscillator for generation of a carrier frequency, from which both the bit clock pulse and the sample signal are derived by frequency division.

Finally, it is advantageous that the sign of the input signal has no influence on the result of the decoding. In other words, the method according to the invention is insensitive to polarity reversal of the signal to be decoded.

BRIEF DESCRIPTION OF THE DRAWINGS

The above and other objects, advantages and features of the invention will become more apparent from the following description taken is conjunction with the accompanying drawings, wherein.

DETAILED DESCRIPTION OF THE PREFERRED EMBODIMENTS

Figure 1:
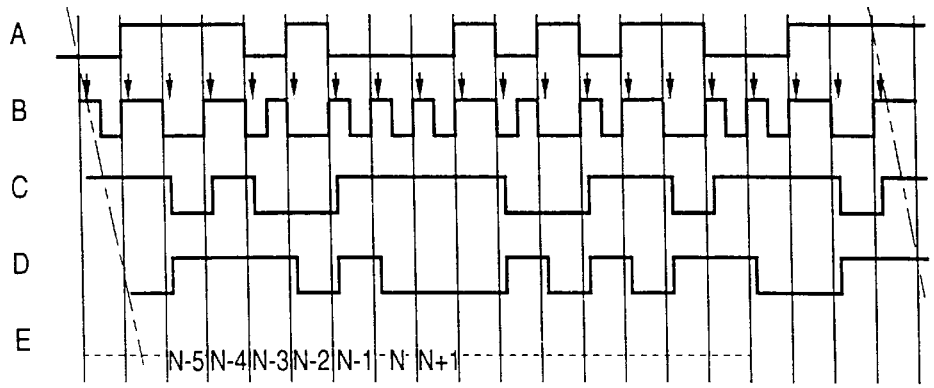
FIG. 1 is a time diagram of the signal level variations occurring in coding and decoding for explaining the method according to the invention.

In FIG. 1 in the upper line A the uncoded information signal is illustrated. It has a predetermined bit clock cycle, the bit periods of which are numbered in the lowermost line E. The information signal consists of a sequence of zero bits (lower level) and one bits (upper level). The information signal A is subjected to a diphase coding and the diphase-coded signal is represented in the second line B. It is distinguished in that between every two bit periods it has an edge, i.e. a level jump. Within each bit period the level remains unchanged when the bit is a one bit, as in the bit periods N–5, N–4 and N–2, whilst the zero bits are distinguished by an additional level jump, i.e., an edge in the center of the bit period, as represented in the bit periods N–3, N–1, N and N+1. (The reverse code agreement is also possible, i.e., level jump in the center of the one bit). The diphase-coded signal B is the input signal to be decoded with the method according to the invention.

As mentioned, in the decoding method hitherto known, a time window is set in the centre of each bit period and it is detected whether an edge occurs within the time window. With this method, the disadvantages of which have already been explained, each individual bit is thus identified as a zero or one in dependence upon the adjacent bits.

The method according to the invention operates without a time window solely with a point sampling of the coded signal. In FIG. 1, in the coded signal profile, sampling instants are indicated in each bit period in line B by arrows. These sampling instants have the same frequency as the bit clock pulse, but their exact phase position with respect to the bit clock pulse is substantially non-critical, as will be explained below. At the sampling instants indicated by the arrows the particular level of the coded signal B is sampled, thereby obtaining the level profile illustrated in the third line C. This is still not the decoded signal because on its own this does not result in a clear distinction between zero and one bits. Thus, the zero bit N–3 and the one bit N–2 have the same sample level. Consequently, the method according to the invention includes a second step in which the sample level in each bit period is compared with the sample level of the previous bit period. The respective preceding bit is assessed as a zero bit or one bit depending on whether the levels are the same or different.

Consequently, the decoding method according to the invention utilizes the property of diphase-coded signals that each one bit involves only one level change whilst each zero bit involves two level changes. If the sampled signal profile C in FIG. 1 is evaluated in that in each bit period a signal level which has remained the same compared with the previous bit period is interpreted as zero (such as with N–2) but a signal level which is different from the preceding bit period is interpreted with one (as with N–5, N–4, N–3 and N–1), then the signal profile indicated at D is obtained. It can be seen that the signal profile D is identical to the signal profile A and is nearly time-displaced with respect thereto by about one bit period. The signal profile D thus represents a decoding of the diphase-coded signal B and the recovery of the information signal A.

As described, with the method according to the invention, the level sample signal C is evaluated in that the sample level of each bit period is compared with the preceding bit period and a level change or absence of change detected. As regards hardware and/or software, the logical linking of each sample value with the preceding sample value necessary here can be implemented in various manners, for example by difference formation, multiplication or the like. The linking is however always equivalent to a logic exclusive or link (XOR link) according to the following result table.

TABLE

| Sample Value C | | Decoded Level D |
|---|---|---|
| N–1 | N | N |
| 0 | 0 | 0 |
| 0 | 1 | 1 |
| 1 | 0 | 1 |
| 1 | 1 | 0 |

As mentioned, the exact time position of the sampling instants (arrows in FIG. 1) is substantially not critical. The only requirement is that all the sample points lie in the same half of the bit periods. Consequently, it should be avoided that the sampling instants coincide exactly with the start of a bit period or with the bit centre. However, exact synchronization of the sampling with the bit clock pulse is not necessary. The result of the decoding is also not changed when the sample points do not lie in the first half of the bit periods but in the second. As can easily be verified, although the form of the level profile C obtained by the sampling would then change, after the XOR linking of each sample value with the preceding sample value, the same decoded signal profile D is still obtained; the amount of the time displacement compared with the information signal A would merely change, that is, become smaller.

As can likewise be readily verified, the decoding according to the invention is invariant with respect to a sign reversal of the diphase-coded signal B. If in the signal profile B all the high and low levels are interchanged, then once again another sampled level profile C would admittedly result; however, by the XOR linking with the preceding sample value the same decoded signal profile D is reestablished.

The decoding described above applies to a diphase-coded signal in which the zero bits have the level jump and the one bits do not. As mentioned, an inverted code agreement is also possible, i.e., a level jump only in the one bits. All that it necessary with such a coded signal in the method according to the invention is to modify the logical interconnection of the consecutive sample values so that a change is interpreted as a zero but a constant sample value as a one. This logical interconnection may for example be carried out as addition or as XOR operation with inversion of the result.

A requirement for carrying out the method according to the invention is a sequence of sample signals which have the same frequency as the bit clock pulse but need not necessarily be exactly synchronized therewith. The generation of such a sample signal is particularly easy when the bit clock pulse and sample signal are generated by frequency division of the same oscillator frequency. This requirement is for example met when by means of an oscillator a carrier signal is generated onto which the coded signal is modulated, the bit clock pulse being obtained by frequency division of the carrier frequency. This is the manner of operation for example of a transponder which is interrogated by a transmission-reception station by means of a high-frequency carrier signal and modulates onto the latter a coded signal stored in the transponder which is then again received in the transmission-reception station, demodulated and decoded. Such transponders are used for example in contactless identification systems, the employment of which is particularly relevant for example in start blocking systems for automobiles, antitheft devices, personnel access controls and the like. The decoding method according to the invention can be used particularly advantageously, but not exclusively, for decoding transponder signals.

Figure 2:
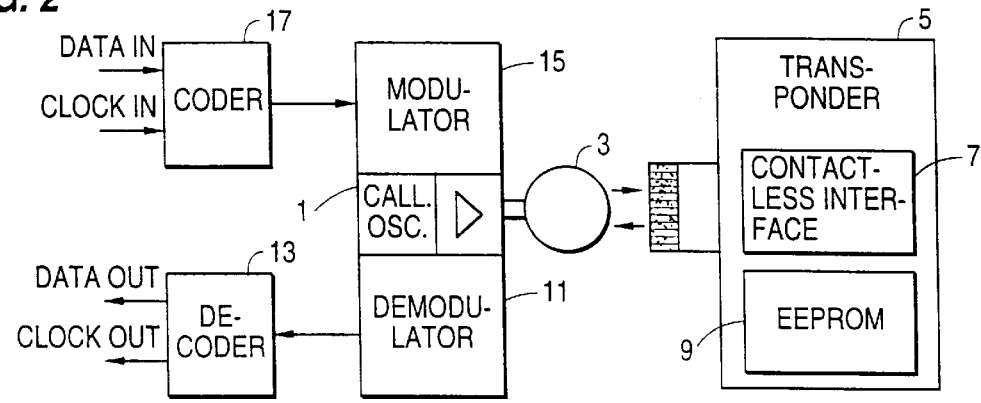
FIG. 2 is a schematic block illustration of a contactless transponder system.

FIG. 2 shows the schematic block circuit diagram of a transponder system. The base station transmits a carrier signal generated by an oscillator 1 via an antenna 3 in contactless manner to a transponder 5. At the latter the carrier signal is modulated in a contactless interface 7 with a coded signal which is stored in a memory 9, for example an EEPROM, modulated, for example amplitude-modulated, and sent back to the antenna 3 of the base station. In the base station the coded signal is separated from the carrier signal in the demodulator 11 and decoded in a decoder 13, for which the method according to the invention can be used. Depending on the configuration of the transponder system, it is possible to modulate the carrier signal emitted by the base station by means of a modulator 15 with an information signal coded by the decoder 17, for example in order to write an identification code into the memory 9 of the transponder 5.

Figure 3:
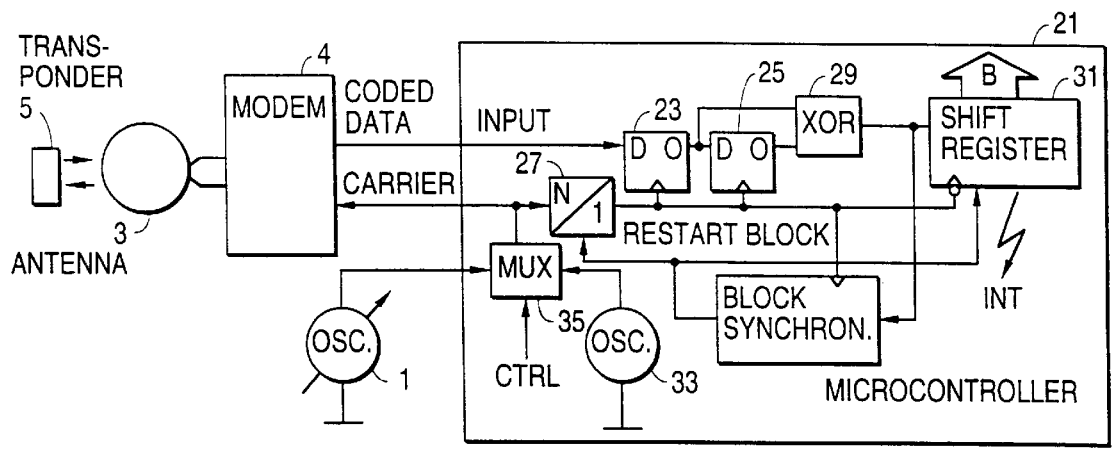
FIG. 3 is a block circuit diagram of a decoder circuit for carrying out the method according to the invention.

FIG. 3 shows an example of 94 embodiment for a decoder circuit preferably configured as 94 integrated circuit for decoding the diphase-coded signals by the method according to the invention. For this, a microcontroller 21 is preferably used. The oscillator 1 generates a high-frequency carrier signal which is supplied via the antenna 3 to the transponder 5 and is modulated by the latter with the coded signal. The demodulation takes place in the modem 4 of the base station and the coded signal passes to a data input port of the microcontroller 21 and from the latter into two series-connected memory elements which are formed in the example of the embodiment as flip-flops 23, 25. To the control inputs of the flip-flops 23, 25 a sample signal is applied which is generated from the signal of the oscillator 1 by frequency division in a frequency divider 27, with a division ratio N:1 which is equal to the ratio of the carrier frequency to the bit rate used in the transponder 5 in the modulation of the carrier signal. In this manner, a sample signal of frequency equal to the bit clock pulse is applied to the flip-flops 23, 25 so that at each sample instant the actual sample value of the coded signal is fetched from the flip-flop 23 and the preceding sample value from the flip-flop 25. The two sample values are linked together in an XOR gate 29 and the result of the linking, i.e., the decoded signal D of FIG. 1, is stored in a shift register 31, from where the information can be fetched byte-wise and interrupt-controlled by the associated CPU.

Instead of, or intermittently instead of, the external oscillator 1, an internal timer oscillator 33 of the microcontroller can furnish the signal to be divided by the frequency divider 27 for generation of the sample signal, and a multiplexer 35 can be provided for switching between the two oscillators 1 and 33.

As mentioned, the method according to the invention is largely insensitive with respect to the exact position of the sampling instants. Thanks to this property, the system can be made up with an economical RC oscillator for generating the carrier frequency. It is merely necessary to avoid excessively large drifting of the sample signal with respect to the bit clock pulse derived from the carrier frequency. To make the system more robust in this respect, in a further development of the invention a simple follow-up synchronization of the sample signal is provided. For this purpose the fact is utilized that in the coded signal as a rule block synchronizing characters are provided which separate the individual bit blocks from each other. These block synchronizing characters, which are implemented by a special bit sequence, are detected in the bit sequences stored in the shift register 31 with the aid of a block synchronizing circuit 37. This circuit generates synchronizing signals which can for example control the byte-wise fetching of the stored data from the shift register 31. According to the invention, by means of the block synchronizing signal, the sample signal supplied by the frequency divider 27 to the flip-flops 23, 25 can also be subsequently synchronized, by briefly changing the division ratio of the frequency divider 27. This ensures a stable position of the sampling instants within the bit periods, for example at about a quarter of the bit period. This follow-up synchronization does not involve any additional expenditure because information present in any case is employed.

The sampling with the aid of a microcontroller has the advantage that each sampling operation can be carried out as simple interrupt operation and requires only a very short duration compared with the bit period. Each sample-interrupt routine need not last more than one to five percent of the bit period, so that the greater part of the total time is not used for the decoding but is available for other function purposes.

Figure 4:
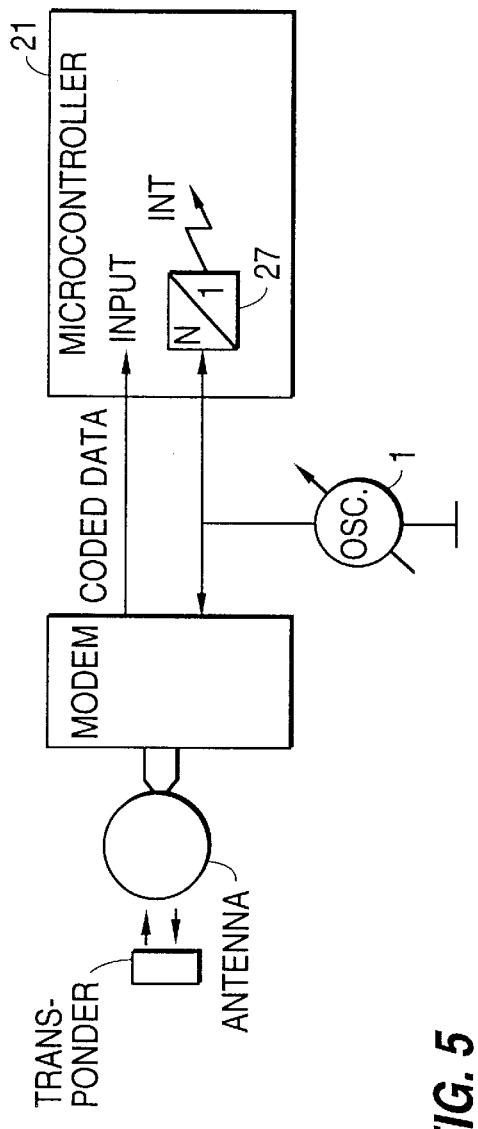
FIG. 4 is a functional block diagram for a method according to the invention.
Figure 5:
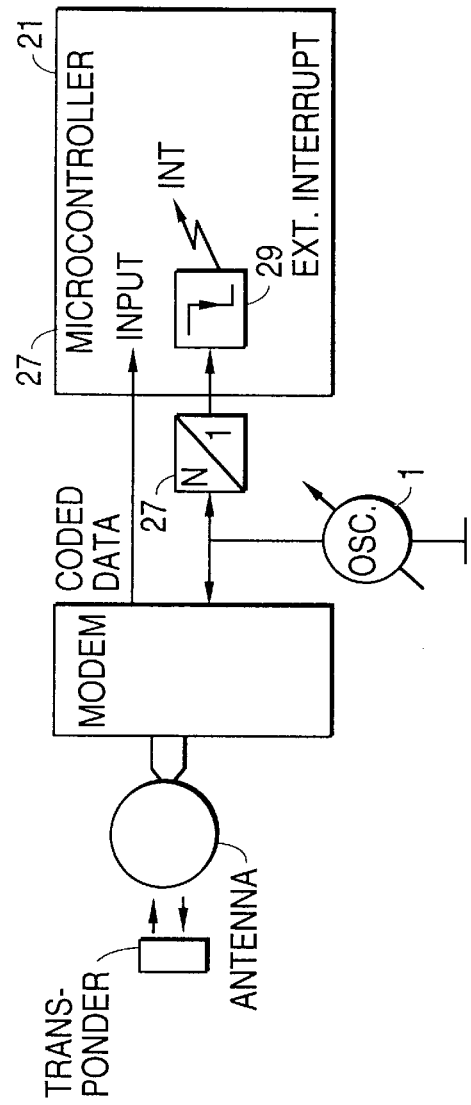
FIG. 5 is another functional block diagram for the method according to the invention.

The components of the decoder circuit illustrated in circuit parts in separate hardware in FIG. 3 may also be implemented purely in software by appropriate programming of function blocks of the microcontroller. As indicated in FIG. 4, for this purpose only a corresponding microcontroller 21 is required having a data input port for the coded signal and an input for the signal from the external oscillator 1, from which in the microcontroller the interrupt signal serving for the sampling and equal infrequency to the bit clock pulse is generated by frequency division by means of the frequency divider 27. However, in accordance with FIG. 5, it is also possible to supply the signal of the oscillator 1 already divided by means of an external frequency divider 27 to an external interrupt input of the microcontroller 21 as external interrupt signal, a function block 37 responsive to the edge of the external interrupt signal in the microcontroller generating the internal interrupt command for sampling the decoder signal.

What is claimed is:

1. A method for decoding a diphase-coded digital signal which at a start of each bit period has a level edge, and zero and one bits of which differ in a presence or an absence of a level edge in a center of the bit period, the method comprising the steps of:

sampling a level of the coded signal with a sample signal equal in frequency to a bit clock pulse of the coded signal at instants lying in one of a first half and a second half of the bit period; and generating, as a decoded signal, an output signal indicating a change of each sample value compared with a preceding sample value, wherein the coded signal is modulated onto a high-frequency carrier signal, wherein the coded signal bit clock pulse is frequency divided with respect to the carrier frequency and synchronized therewith, and wherein the sample signal is obtained by frequency division of the carrier frequency.

2. An apparatus for decoding a diphase-coded digital input signal, comprising:

means for generating a sample signal equal in frequency to a bit clock pulse of the input signal;

sampling means for sampling a level of the input signal at instants defined by the sample signal;

a logic circuit for logic interconnection of each sample value with the preceding sample value in accordance with an exclusive-OR function;

a microcontroller, to the input of which the input signal is applied;

an oscillator disposed in the microcontroller or connected from outside, said oscillator being provided for generating interrupt commands which have a same frequency as the bit clock pulse of the input signal, and the microcontroller being programmed for logical linking of the signal levels of the input signal sampled by every two consecutive interrupt commands in accordance with the exclusive-OR function; and a shift register in which a bit sequence of the decoded signal can be stored and can be fetched blockwise by interrupt commands.

* * * * *